US007482853B2

United States Patent
Koch et al.

(10) Patent No.: US 7,482,853 B2
(45) Date of Patent: Jan. 27, 2009

(54) METHOD AND APPARATUS FOR SWITCHING AUDIO AND DATA SIGNALS THROUGH A SINGLE TERMINAL

(75) Inventors: Donald Giles Koch, Satellite Beach, FL (US); Douglas Lawton Youngblood, Palm Bay, FL (US); Christopher Ludeman, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 13 days.

(21) Appl. No.: 11/419,620

(22) Filed: May 22, 2006

(65) Prior Publication Data

US 2007/0132501 A1 Jun. 14, 2007

Related U.S. Application Data

(60) Provisional application No. 60/750,120, filed on Dec. 14, 2005.

(51) Int. Cl.
*H03L 5/00* (2006.01)

(52) U.S. Cl. ....................................... 327/407; 327/408

(58) Field of Classification Search ................. 327/430, 327/404, 407–410
See application file for complete search history.

(56) References Cited

U.S. PATENT DOCUMENTS

| 4,682,061 A | * | 7/1987 | Donovan | ..................... 327/434 |
| 5,233,233 A | * | 8/1993 | Inoue et al. | .................. 327/408 |
| 2003/0006811 A1 | * | 1/2003 | Oosawa et al. | .............. 327/113 |

* cited by examiner

*Primary Examiner*—Tuan T Lam
*Assistant Examiner*—Diana J Cheng
(74) *Attorney, Agent, or Firm*—Fogg & Powers LLC; Gregory M. Taylor (57) ABSTRACT

A MOSFET-based, multi signal-switching circuit controllably passes analog/audio signals and digital signals through a common terminal to a single connector. Analog/audio signals are coupled through a single N-channel MOSFET analog signal switch which, when turned-ON, minimizes distortion of the analog/audio signal and capacitive loading to an adjacent, MOS-based or CMOS-based digital data signal switch. A respective turn-OFF circuit maintains its associated switch MOSFET turned OFF.

18 Claims, 6 Drawing Sheets

METHOD AND APPARATUS FOR SWITCHING AUDIO AND DATA SIGNALS THROUGH A SINGLE TERMINAL

CROSS-REFERENCE TO RELATED APPLICATION

The present application claims the benefit of U.S. Application Ser. No. 60/750,120, filed Dec. 14, 2005, by Donald G. Koch et al, entitled: "Method and Apparatus of Switching Audio and Data Signals Through a Single Terminal," assigned to the assignee of the present application, and the disclosure of which is incorporated herein.

FIELD OF THE INVENTION

The present invention relates in general to electronic switching circuits and components thereof, and is particularly directed to a new and improved MOSFET-based, multi signal-switching circuit architecture, which is configured to controllably pass multiple types of signals, such as analog/audio signals and high speed digital signals (e.g., USB signals), through a single terminal. Analog/audio signals are coupled through a single analog/audio signal-coupling (MOSFET) switch which, when turned-ON, is effective to minimize distortion of the audio signal and, when turned-OFF, is effective to minimize capacitive loading to an adjacent, digital data signal (MOSFET) switch. The digital data signal switch is used to pass high speed digital signals with minimal distortion and speed degradation. As such, the multi signal-switching circuit architecture of the invention enables an application device to pass digital data signals containing audio information into the application device, and also pass analog signals out of the application device at high quality signal levels by means of a single connector, thereby minimizing space, weight, and cost of the application device.

BACKGROUND OF THE INVENTION

Figure 1A:
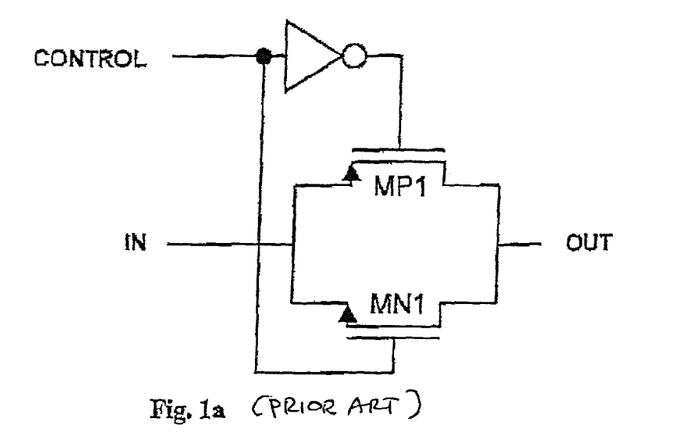
FIG. 1a schematically illustrates the circuit configuration of a conventional CMOS-based analog signal switching circuit.

A conventional complementary polarity MOSFET-based analog signal switching circuit FIG. 1a for controllably passing signals, such as audio or digital data signals, between input and output ports thereof is schematically illustrated in FIG. 1a. As shown therein, the switching circuit comprises a PMOS transistor MP1 and an NMOS transistor MN1, which have their source-drain paths connected in parallel between an input port or terminal IN and an output port or terminal OUT. The gate of the NMOS transistor MN1 is connected directly to a CONTROL terminal, while the gate of PMOS transistor MP1 is coupled through an inverter INV to the CONTROL terminal.

In operation, a prescribed maximum or minimum control voltage is applied via the CONTROL terminal to the gate terminals of the two complementary MOSFETs, in order to turn these switching devices OFF or ON, and thereby control the conductive or signal pass-through state of the switching circuit. MOSFETs MN1 and MP1 are complementary polarity devices to accommodate input signals that may extend to the voltage extremes, so that, when one MOSFET is off (so as to block the passage of signals therethrough), the other (complementary polarity) MOSFET is on (in a low resistance state, so as to allow the passage of signals therethrough).

An input signal applied to the input terminal IN serves as the source voltage for, and thereby determines the ON-resistance of, each MOSFET. The gate-to-source voltage can be less than the threshold voltage of either MOSFET, which puts it into the cut-off region of operation. This occurs when the input signal approaches the voltage of the positive or negative power supply rail.

Figure 1B:
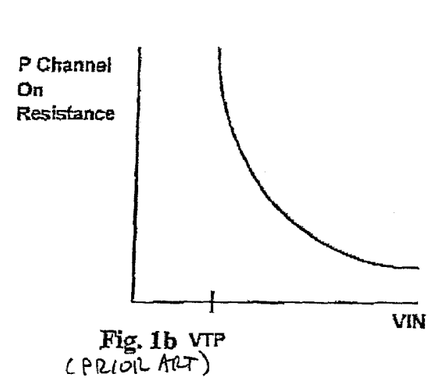
Figure 1C:
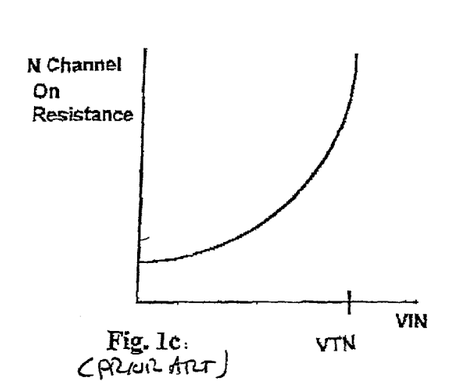
Figure 1D:
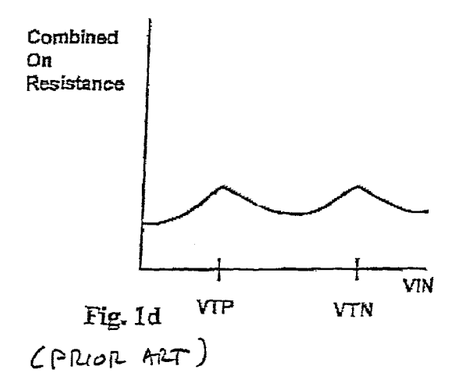
FIG. 1d illustrates the combined ON-resistance of the parallel combination of the two complementary transistors of FIG. 1a as a function of input voltage.

FIGS. 1b and 1c illustrate variations of resistance vs. input voltage for the individual PMOS transistor and the NMOS transistor, respectively, of the CMOS-based analog switching signal circuit of FIG. 1a. As shown in FIG. 1b, as the input voltage increases, the ON-resistance of the P-channel device decreases, while FIG. 1c shows that the ON-resistance of the N-channel device increases with an increase in input voltage. FIG. 1d illustrates that the combined ON-resistance of the parallel combination of the P-channel and N-channel MOSFETs of the analog signal switching circuit FIG. 1a has a slightly undulating variation with input voltage.

Where it is desired to controllably interface multiple types of signals through a commonly shared port, it has been conventional practice to replicate the switch circuit of FIG. 1a for each type of signal, and then connect such switching circuits in parallel between the commonly shared port and separate signal terminals or ports associated with the various signal types. Thus, an application for coupling both audio signals and high speed digital data signals would entail a parallel combination of two of the dual MOSFET switching circuits of FIG. 1a—one for audio signals and the other for high speed digital data signals.

Unfortunately, such a replicated switch-based architecture has a number of inherent drawbacks. A first is the fact that the overall circuit occupation area is fairly substantial, since each signal switching path involves the same parallel combination of dual MOSFET switching circuits. This results in high cost and substantial capacitive loading at the common terminal. A second shortcoming is the fact that the gate-to-source voltage of the audio circuit's switching MOSFETs varies with the analog (audio) signal, which produces modulation of the ON-resistance of the switching MOSFETs, thereby causing distortion of the audio signal.

SUMMARY OF THE INVENTION

In accordance with the present invention, these and other shortcomings of the use of multiple, parallel-connected MOSFETS of the conventional dual MOSFET-based signal switching architecture shown in FIG. 1a, to controllably switch multiple types of signals, are effectively obviated by a new and improved method and circuit arrangement, that uses a CMOS-based or MOS-based switching circuit to switch high speed data signals, and a single, auxiliary switching (N-channel) MOSFET-based circuit to controllably switch or pass audio signals therethrough to the common audio/data signal port.

It should be noted that in certain applications where the digital data signal is of reduced amplitude, a single MOSFET may be used to switch the data signals instead of a CMOS-based switch, thereby saving additional area and minimizing parasitic capacitance. This combination of a single MOSFET-switch for the audio signal path and a CMOS-based or MOS-based switching circuit for the digital data path implements a single pole, double throw (SPDT) switching function, with the auxiliary MOSFET switching circuit being biased either ON or OFF, so that it operates as an application specific switch. This enables both switching circuits to be tailored for the applications in which they are to perform. For example, the auxiliary switching circuit may be employed to pass audio signals to a speaker load with minimal distortion, while the CMOS-based or MOS-based circuit is used to pass high speed data signals with minimal loss of speed.

In accordance with a first embodiment of the invention, the single analog/audio signal switching N-channel MOSFET is biased 'ON' by a Zener diode coupled between the gate and source terminals of the MOSFET. The common connection of the MOSFET's gate of the Zener diode is switchably coupled to the output of a constant current source. The Zener diode-based biasing arrangement causes the gate-to-source voltage of the N-channel MOSFET to be clamped at a substantially constant value during the ON or analog/audio signal-passing state of the switching MOSFET. This offers several advantages over using two of the conventional signal CMOS-based analog switching circuits of FIG. 1a to implement the audio and digital data signal paths of a SPDT switching function.

A first benefit results from clamping the gate-to-source voltage of the audio signal switch's N-channel MOSFET at a substantially constant value. This serves to reduce audio signal distortion, which occurs in the switching circuit of FIG. 1a as a result of the ON-resistance through the MOSFET switch changing with variations in input voltage (the audio signal). Secondly, the use of a single N-channel MOSFET to implement the audio signal switching function reduces the parasitic capacitance that is coupled to the high speed data signal switching circuit by the audio signal switching circuit. The load that the audio signal switch drives is often relatively small (e.g., between four and thirty-two ohms), so that the ON-resistance of the audio switch MOSFET must be very small, in order to avoid unnecessary signal loss in the signal path through the audio switch. This mandates that the audio signal switch use very large MOSFET devices relative to the size of the devices of the high speed data signal switch. Since the P-channel FET of the switching circuit of FIG. 1a is eliminated from the audio signaling switch, the audio switch enjoys a substantial reduction in associated parasitic capacitance, since the (eliminated) P-channel FET is often two to three times larger than its parallel N-channel device.

Pursuant to a second embodiment of the invention, the gate-to-source voltage-clamping Zener diode of the audio signal switch of the first embodiment is replaced by a gate-to-source resistor; the two circuits are otherwise the same. The injection of a constant bias current from the constant current source I through the gate-to-source resistor sets the gate-to-source bias voltage of the N-channel switching MOSFET at a constant value, corresponding to the product of the resistance of the gate-to-source resistor and the value of the constant current. This allows the multi-signal switching circuit of the second embodiment to offer the same advantages as the first embodiment.

In a third embodiment of the invention, the gate-to-source-coupled Zener diode and resistor of the audio signal switch of the first and second embodiments, respectively, are replaced by an auxiliary, N-channel biasing MOSFET, which provides the desired constant gate-to-source voltage for the audio switch's N-channel MOSFET. The third embodiment of the invention offers an improvement over the first and second embodiments, in that the parameters of the (N-channel) biasing MOSFET can be closely matched with those of the audio signal switching (N-channel) MOSFET, to provide improved performance for variations in voltage, temperature, and process parameters, such as threshold voltage. Also, the gate-to-source voltage of the audio signal switching N-channel MOSFET can be precisely set to maintain its ON-resistance at a value that has minimal variability. This is readily achieved by setting the ratio of the sizes of the two N-channel MOSFETs of the audio signal switch for a given amount of current from the constant current source. In addition, the third embodiment may be preferred over those of the first and second embodiments because of its reduced variability due to process.

A fourth embodiment of the invention includes additional 'turn-off' circuitry for ensuring that once the switching MOSFETs of the respective data and audio signal switches have been turned OFF, they stay turned OFF, as intended. To this end, the audio signal switch is augmented to include an auxiliary P-channel MOSFET coupled between the audio signal input line and the gate-to-source-biasing N-channel MOSFET. The auxiliary P-channel MOSFET has its source connected in common with the source of the N-channel biasing MOSFET, and its drain and gate connected in common to the audio signal input line. The audio signal switch also includes a further N-channel MOSFET, which has its source-drain path coupled across the gate and source of the audio signal switching N-channel MOSFET, and its gate coupled to receive a switching control voltage. The further N-channel MOSFET is turned ON by a control voltage applied to its gate, so as to effectively provide a short across the gate and source of the N-channel audio signal switching MOSFET, and thereby maintain the switching MOSFET MN2 turned OFF, as intended.

Similarly, for the data signal switching path, the data signal switch is augmented to include an auxiliary N-channel MOSFET, which has its source-drain path coupled across the gate and source of the N-channel switching MOSFET of the CMOS switching pair. The gate of this auxiliary N-channel MOSFET and the gate of the P-channel switching MOSFET of the data switch's CMOS pair are connected in common to the output of the inverter. The data signal switching path's auxiliary N-channel MOSFET is turned ON by a control voltage applied to its gate, so as to effectively provide a short across the gate and source of the digital data signal switching N-channel MOSFET, and thereby maintain that switching MOSFET turned OFF, as intended. The gate of the N-channel switching MOSFET of the data switch's CMOS pair, rather than being directly connected to receive a switching control voltage that is applied to the input of the inverter, as in the first, second and third embodiments, is connected to the control voltage terminal by way of a further switch, which is controlled by and coupled to receive the switching control voltage.

The functionality of the circuit architecture of the fourth embodiment of the invention differs from the traditional method of driving a MOSFET gate voltage to the appropriate power supply rail voltage. For a given application, the audio input signal applied to the audio signal line may be capable of swinging below the voltage (e.g., ground) of the negative power supply rail. If the voltage level of the audio signal is below ground by more than the threshold voltage of the N-channel audio signal switching MOSFET of the audio signal switch, simply driving the gate voltage of the N-channel audio signal switching MOSFET to ground would not be adequate to maintain that switching MOSFET turned OFF. In order to avoid this problem, the further N-channel MOSFET is turned ON by the control voltage applied to its gate, so as to effectively provide a short across the gate and source of the N-channel audio signal switching MOSFET, and thereby maintain the switching MOSFET MN2 turned OFF, as intended.

This same approach is used for the data signal switching path, wherein the N-channel switching MOSFET of the data signal switch is maintained OFF as a result of turning ON the further N channel MOSFET, by applying to its gate output of the inverter, which is the complement of the control voltage. This effectively provides a short across the gate and source of the N-channel data signal switching MOSFET, and thereby maintains the N-channel data signal switching MOSFET turned OFF, as intended.

A fifth embodiment of the invention is configured identically to the fourth embodiment, except that it dispenses with the P-channel switching MOSFET of the data signal switching path, so that only a single N-channel MOSFET is employed for the data signal switching path. This serves to reduce semiconductor circuit occupancy area and minimizes parasitic capacitance. Not having to include a P-channel switching MOSFET in the data signal switching path stems from the fact that certain applications employ digital data signals having a relatively reduced amplitude (e.g., on the order of only several hundred millivolts), which may be readily switched by means of a single N-channel device.

The multi signal-switching circuit architecture of the invention is particularly useful in small hand-held devices having audio signal communication capability, such as, but not limited to, MP3 players, cell phones, digital cameras, and personal digital assistants (PDAs), where small size, reduced cost, and high performance have become standard requirements. The invention allows the use of a single mechanical connector (in place of multiple connectors of a conventional device) for passing high quality data signals (which may include audio information or a combination of audio and video for playback) into the device, thereby reducing size, weight and cost. Also, the reduction of parasitics in the digital signal path improves the data rate that can be used for transferring data into or out of the device, thereby reducing data transfer time and allowing larger memory sizes.

BRIEF DESCRIPTION OF THE DRAWINGS

FIGS. 1b and 1c respectively illustrate variations of resistance vs. input voltage for the individual NMOS transistor and the PMOS transistor of the CMOS-based analog switching signal circuit of FIG. 1a;

DETAILED DESCRIPTION

Before describing the details of a non-limiting embodiment of the SPDT switching circuit architecture of the present invention, it should be observed that the invention resides primarily in a modular arrangement of conventional electronic circuit components. In terms of a practical implementation facilitating its manufacture as a printed circuit-based package, this modular arrangement may be readily configured as a field programmable gate array (FPGA) and application specific integrated circuit (ASIC) chip set. As a consequence, the circuit configuration of the inventive switching circuit and the manner in which it is coupled to a single signalling interface port have been illustrated in a readily understandable schematic diagram format, which shows only those specific details that are pertinent to the present invention, so as not to obscure the disclosure with details that will be apparent to one skilled in the art having the benefit of the description herein.

Figure 2:
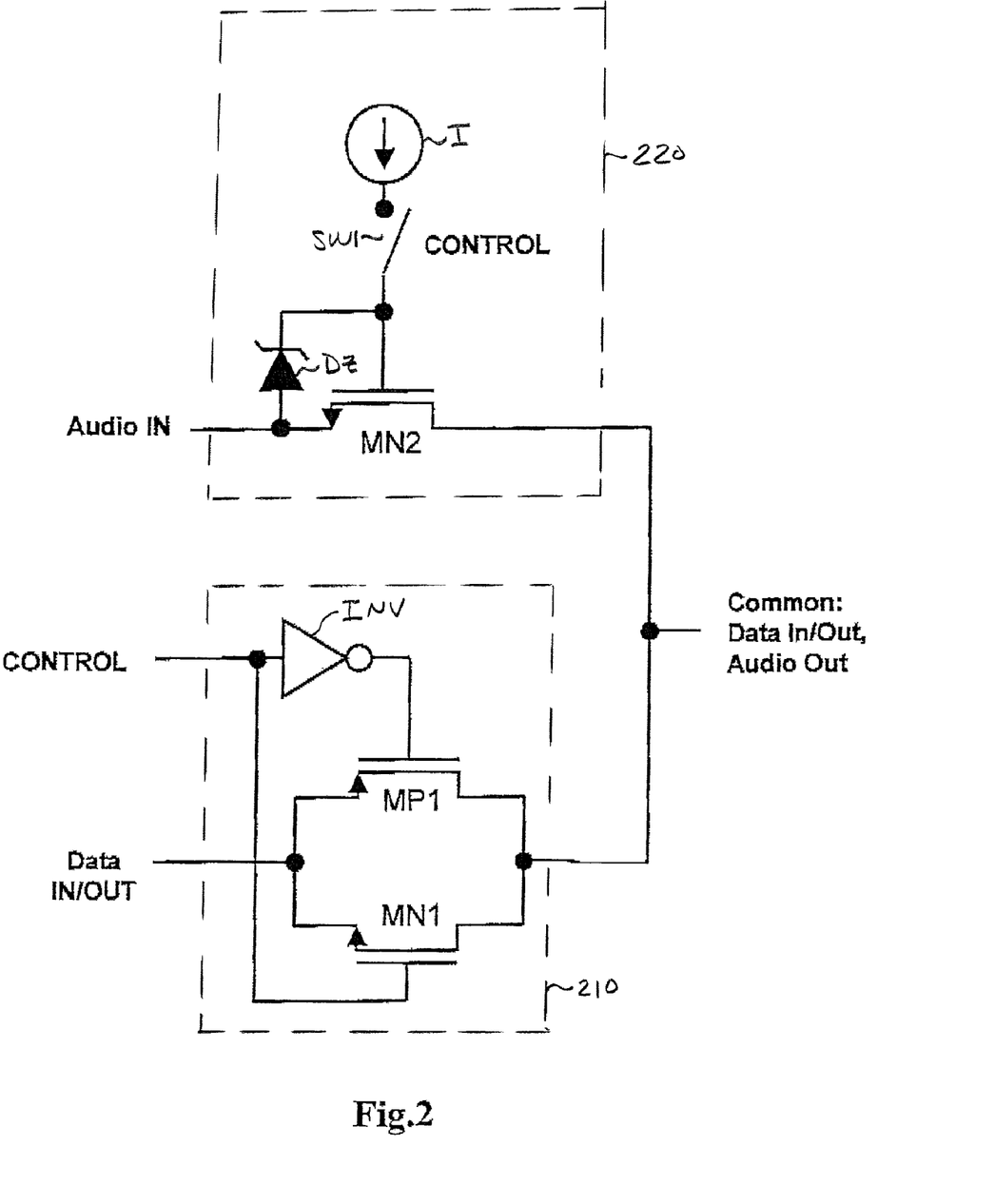
FIG. 2 schematically illustrates a first embodiment of the MOSFET-based, multi-signal switching circuit architecture of the present invention, wherein a single N channel switching MOSFET of an audio signal channel portion of the switching circuit is biased ON by a Zener diode coupled between the gate and source terminals thereof, and a constant current source coupled to the gate terminal.

Attention is now directed to FIG. 2, which schematically illustrates a first embodiment of the multi-signal SPDT switching circuit of the present invention, as a combination of a high speed data signal switch 210, which may be implemented by the CMOS switching circuit of FIG. 1a, and an auxiliary analog (e.g., audio) signal switch 220, which is implemented by a single NMOS transistor MN2, having its source-drain path coupled between an analog/audio input terminal/port 'Audio In' and the signalling interface terminal/port 'Common', through which analog/audio output signals, as well as data input and output signals, are coupled. As noted previously, porting both analog/audio and data signals to the same signalling interface terminal 'Common' allows the use of a single mechanical connector to pass high quality data signals into the device, thereby reducing size, weight and cost.

In the first embodiment of the invention shown in FIG. 2, the single analog/audio signal switching N-channel MOSFET MN2 of the auxiliary analog signal switch 220 is switchably turned 'ON' by a fixed gate-to-source voltage-biasing Zener diode $D_z$ coupled between the gate and source terminals of the switching N-channel MOSFET MN2, and by a constant current output of a constant current source I, that is switchably coupled through a switch SW1 to the gate of the analog signal switching transistor N-channel MN2, in response to the application of a control voltage 'CONTROL' to the switch SW1. For the 'ON' (analog/audio signaling-coupling) state of the analog signal switching MOSFET MN2, the Zener diode-based gate-to-source voltage biasing arrangement of FIG. 2 causes the gate-to-source voltage of NMOS transistor MN2 to be fixed or clamped at a substantially constant value.

As pointed out previously, this offers several advantages over using two of the conventional signal CMOS-based analog switching circuits of FIG. 1a to implement the analog/audio and digital data signal paths of a SPDT switching function. A first is that it reduces audio signal distortion, such as that produced in the switching circuit of FIG. 1a as a result of the ON-resistance through the MOSFET switch changing with variations in input voltage (the analog/audio signal). A second is that it reduces parasitic capacitance coupled to the high speed data signal switching circuit 210 by the audio signal switching circuit 220. As noted earlier, the load that the audio signal switch 220 drives is often relatively small (e.g., between four and thirty-two ohms), so that the ON-resistance of the audio switch's MOSFET 220 must be very small, in order to avoid unnecessary signal loss in the signal path through the audio switch. This mandates that the audio signal switch use very large MOSFET devices relative to the size of the devices of the high speed data signal switch. Since the circuit architecture of FIG. 2 eliminates the P-channel FET from the audio signaling switch 220, it provides a substantial reduction in associated parasitic capacitance, as a conventional switch's P-channel FET is often two to three times larger than its parallel N-channel device.

Figure 3:
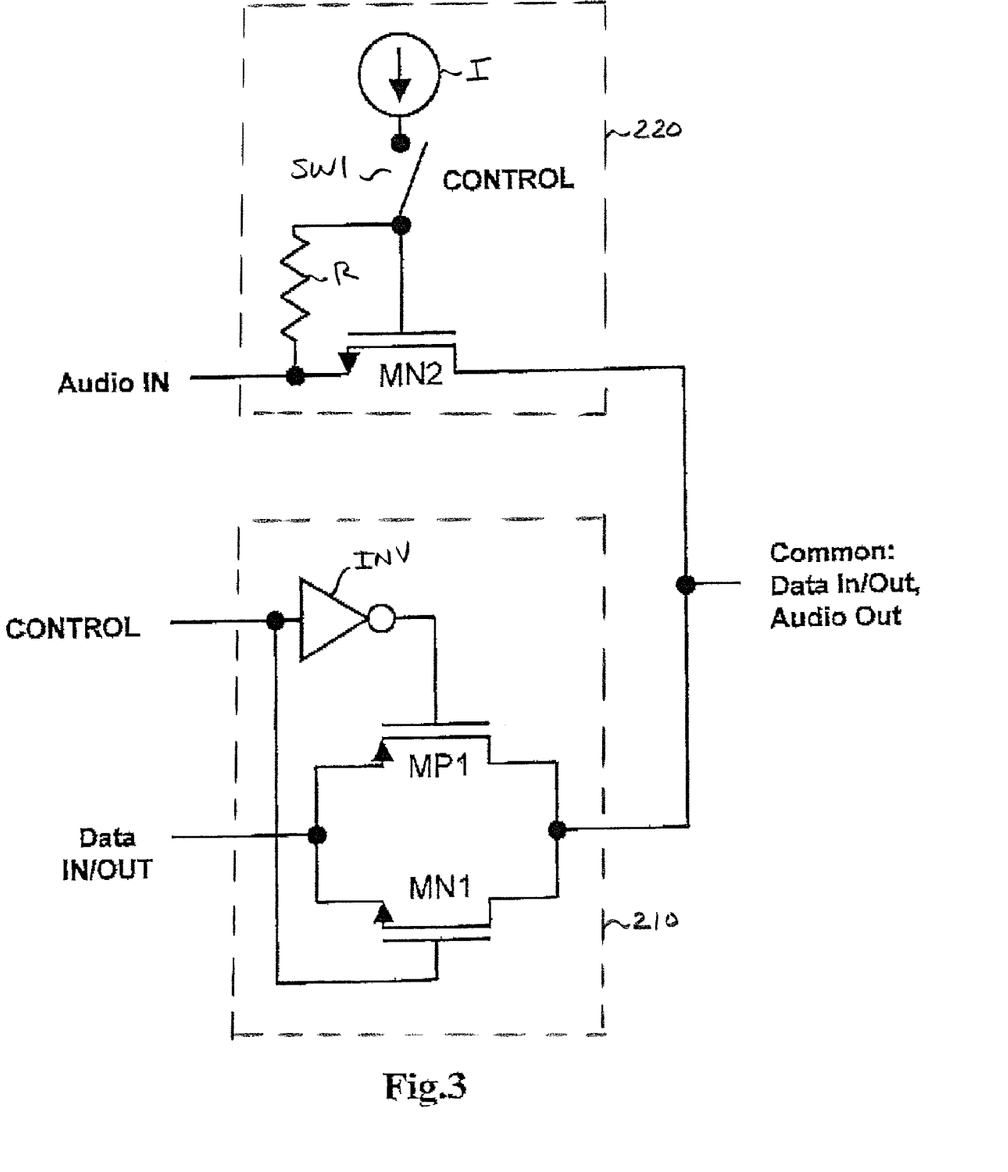
FIG. 3 schematically illustrates a second embodiment of the MOSFET-based, multi-signal switching circuit architecture of the invention, wherein the Zener diode of the embodiment of FIG. 2 is replaced by a resistor.

FIG. 3 schematically illustrates a second embodiment of the multi-signal SPDT switching circuit of the invention, wherein the gate-to-source voltage-clamping Zener diode $D_z$ of the audio signal switch 220 of the embodiment of FIG. 2 is replaced by a gate-to-source coupling resistor R. The multi-signal switching circuit of FIG. 3 is otherwise the same as that of FIG. 2. The injection of a constant bias current from the constant current source I through the gate-to-source coupling resistor R for the ON state of the switching MOSFET MN2 sets the gate-to-source bias voltage VGS of MOSFET MN2 at a constant value, corresponding to the product of the coupling resistance R and the value of the constant current I. This allows the multi-signal switching circuit of FIG. 3 to offer the same advantages as the implementation of FIG. 2, over using two of the conventional signal CMOS-based analog signal switching circuits of FIG. 1a for respective audio and digital signaling paths to implement the desired SPDT switching function.

Figure 4:
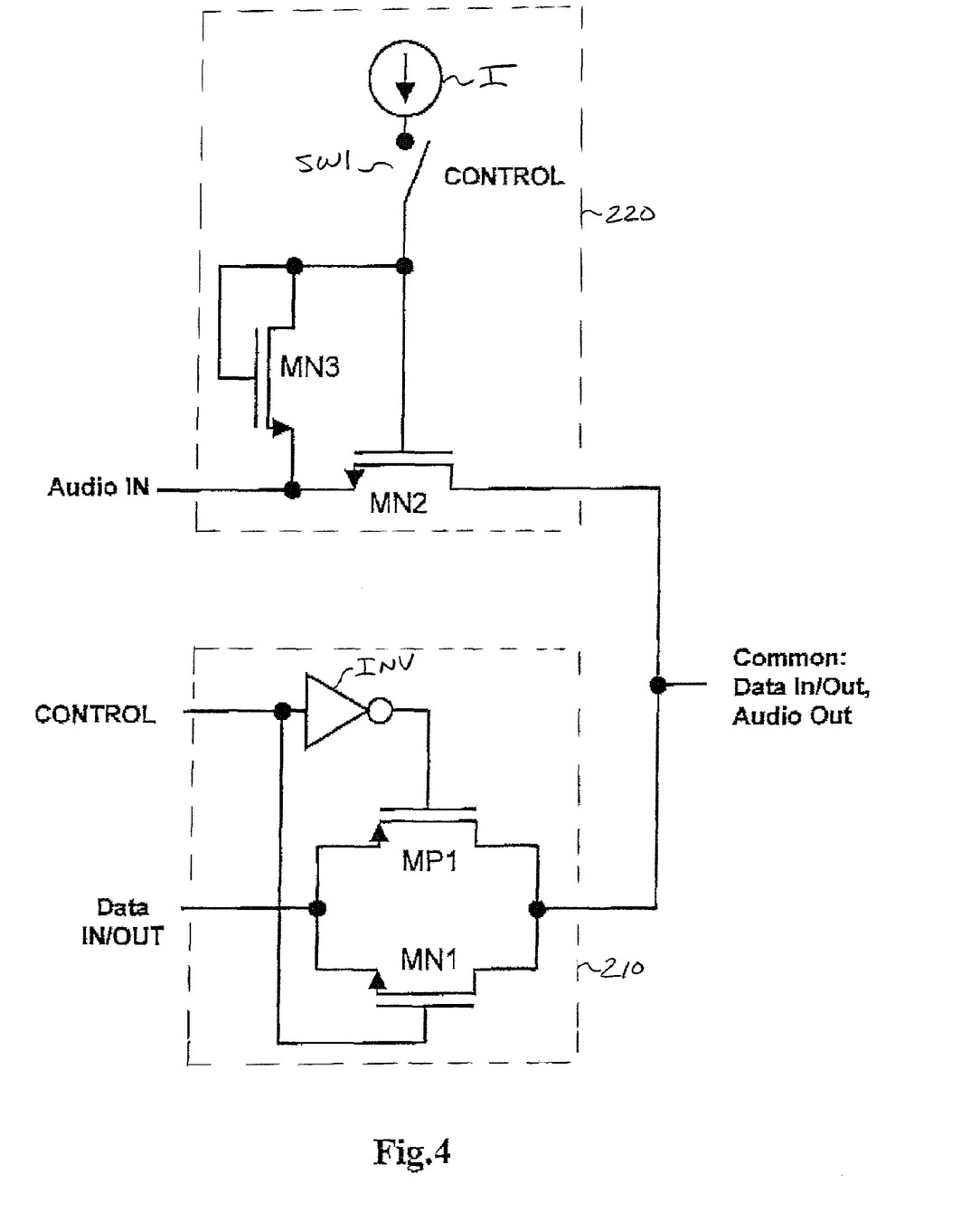
FIG. 4 schematically illustrates a third embodiment of the MOSFET-based, multi-signal switching circuit architecture of the invention, wherein the Zener diode and the resistor of the audio signal switching circuit portion of the switching architectures of FIGS. 2 and 3, respectively, are replaced by an N-channel biasing MOSFET.

FIG. 4 schematically illustrates a third embodiment of the multi-signal SPDT switching circuit of the invention, wherein the Zener diode $D_z$ and the resistor R of the audio signal switch 220 of the respective multi-signal switching circuits of the embodiments of FIGS. 2 and 3 are replaced by a gate-to-source biasing N-channel MOSFET MN3. MOSFET MN3 has its drain and gate connected in common through the switch SW1 to the constant current source I, and its source coupled to the source of the N-channel MOSFET switch MN2. As a result, with switch SW1 being closed for the ON state of the analog/audio signal switching MOSFET MN2, MOSFET MN3 will provide the desired constant gate-to-source voltage for the switching MOSFET MN2.

The use of an N-channel MOSFET as the gate-to-source biasing component in the embodiment of the multi-signal SPDT switching circuit of FIG. 4 offers an improvement over the switching circuit embodiments of FIGS. 2 and 3, since parameters of the N-channel gate-to-source biasing MOSFET MN3 can be closely matched with those of its associated N-channel switching MOSFET MN2. This serves to provide improved performance for variations in voltage, temperature, and process parameters, such as threshold voltage. Also, in the embodiment of FIG. 4, the gate-to-source voltage of the N-channel MOSFET MN2 can be precisely set to maintain its ON-resistance at a value that has minimal variability. This is readily achieved by setting the ratio of the sizes of the two N-channel MOSFETs MN2 and MN3 for a given amount of current supplied by the constant current source I. Also, the embodiment of FIG. 4 is superior to those of FIGS. 2 and 3 because of its reduced variability due to process.

Figure 5:
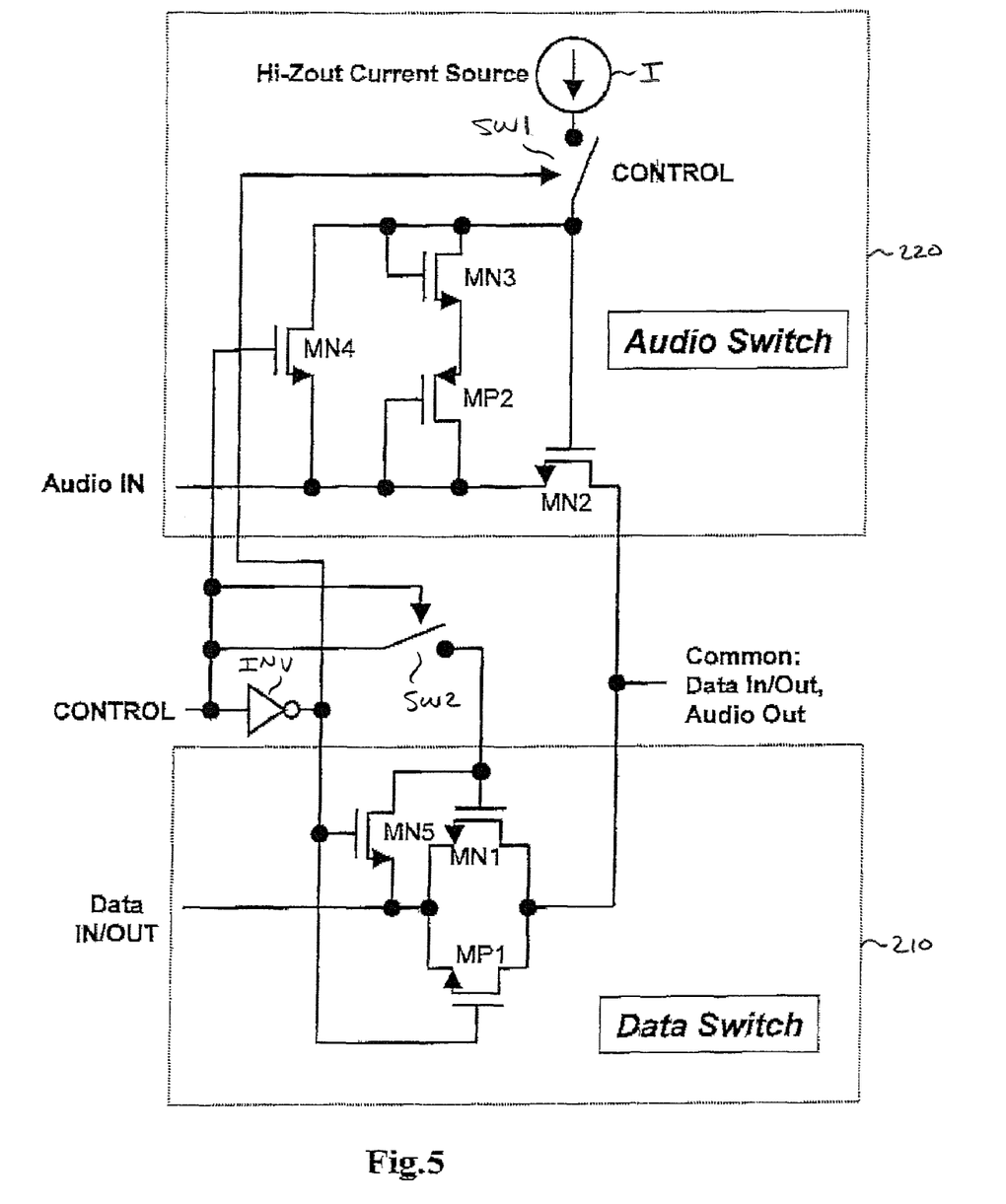
FIG. 5 schematically illustrates a fourth embodiment of the MOSFET-based, multi-signal switching circuit architecture of the invention, which incorporates additional biasing circuitry for maintaining the switching MOSFETs of the circuit's audio and data signal switching paths turned OFF.

FIG. 5 schematically illustrates a fourth embodiment of the multi-signal SPDT switching circuit of the invention, wherein the embodiment of FIG. 4 is augmented to incorporate additional 'turn-off' circuitry that is operative to maintain the switching MOSFETs of the respective data and audio signal switches 210 and 220 turned OFF, during the OFF states of the switches. For this purpose, the analog/audio signal switch 220 further includes an auxiliary P-channel MOSFET MP2 coupled between the analog/audio signal input line 'Audio IN' and the gate-to-source biasing N-channel MOSFET MN3. Auxiliary P-channel MOSFET MP2 has its source connected in common with the source of the N-channel MOSFET MN3, and its drain and gate connected in common to the audio signal input line. In addition, the audio signal switch 220 includes a further, gate-to-source-shorting N-channel MOSFET MN4, which has its source-drain path coupled across the gate and source of the audio signal switching MOSFET MN2, and its gate coupled to receive the switching state control voltage 'CONTROL'. The current source coupling switch SW1 is controlled by way of the output of the inverter INV, to which the switching state control voltage 'CONTROL' is applied.

Similarly, for the data signal switching path, the data signal switch 210 is augmented to include an auxiliary gate-to-source shorting N-channel MOSFET MN5, having its source-drain path coupled across the gate and source of the N-channel switching MOSFET MN1. The gate of the auxiliary N-channel MOSFET MN5 and the gate of P-channel switching MOSFET MP1 are connected in common to the output of inverter INV. The gate of the N-channel switching MOSFET MN1, rather than being directly connected to receive the switching state control voltage 'CONTROL' applied to the input of the inverter INV, as in the embodiments of FIGS. 2, 3 and 4, is connected to the control voltage terminal by way of a switch SW2, which is controlled by and coupled to receive the switching state control voltage 'CONTROL'.

The functionality of the circuit of the embodiment of the multi-signal SPDT switching circuit shown in FIG. 5 differs from the traditional method of driving a MOSFET gate voltage to the appropriate power supply rail voltage. For a given application, the analog/audio input signal applied to the audio signal line 'Audio In' may be capable of swinging below the voltage (e.g., ground (VGND)) of the negative power supply rail. If the voltage level of the analog/audio signal is below ground (VGND) by more than the threshold voltage of the N-channel audio signal switching MOSFET MN2, simply driving its gate voltage to ground (VGND) would not be adequate to maintain MOSFET MN2 turned-OFF. To avoid this problem, the further, gate-to-source shorting N-channel MOSFET MN4 is turned ON by the switching state control voltage CONTROL applied to its gate. This serves to effectively provide a short across the gate and source of the N-channel audio signal switching MOSFET MN2, and thereby maintain the switching MOSFET MN2 turned OFF, as intended.

This same approach is used for the data signal switching path, wherein the N-channel switching MOSFET MN1 of the data signal switch 210 is maintained OFF as a result of turning ON the further N channel MOSFET MN5, by applying to its gate output of the inverter INV, which is the complement of the control voltage CONTROL (and which is used to turn OFF the P-channel switching MOSFET MP1, as in the conventional CMOS data switch of the circuit of FIG. 1a). This serves to effectively provide a short across the gate and source of the N-channel data signal switching MOSFET MN1, and thereby maintain the N-channel data signal switching MOSFET MN1 turned OFF, as intended.

The analog/audio signal switching circuitry of the embodiment of FIG. 5 is particularly suited for coupling audio signals to speaker loads, such as headphones that typically have an impedance (load resistance) on the order of thirty-two ohms. Because the constant current source I that is used to bias the analog/audio signal switching N-channel MOSFET MN2 into the ON state flows into this load impedance, it produces a DC offset voltage across the load. Although this produces a DC offset voltage that reduces the maximum signal range, this offset voltage can be kept quite small relative to the audio signal magnitude, and would typically be less than one-hundred microvolts.

Figure 6:
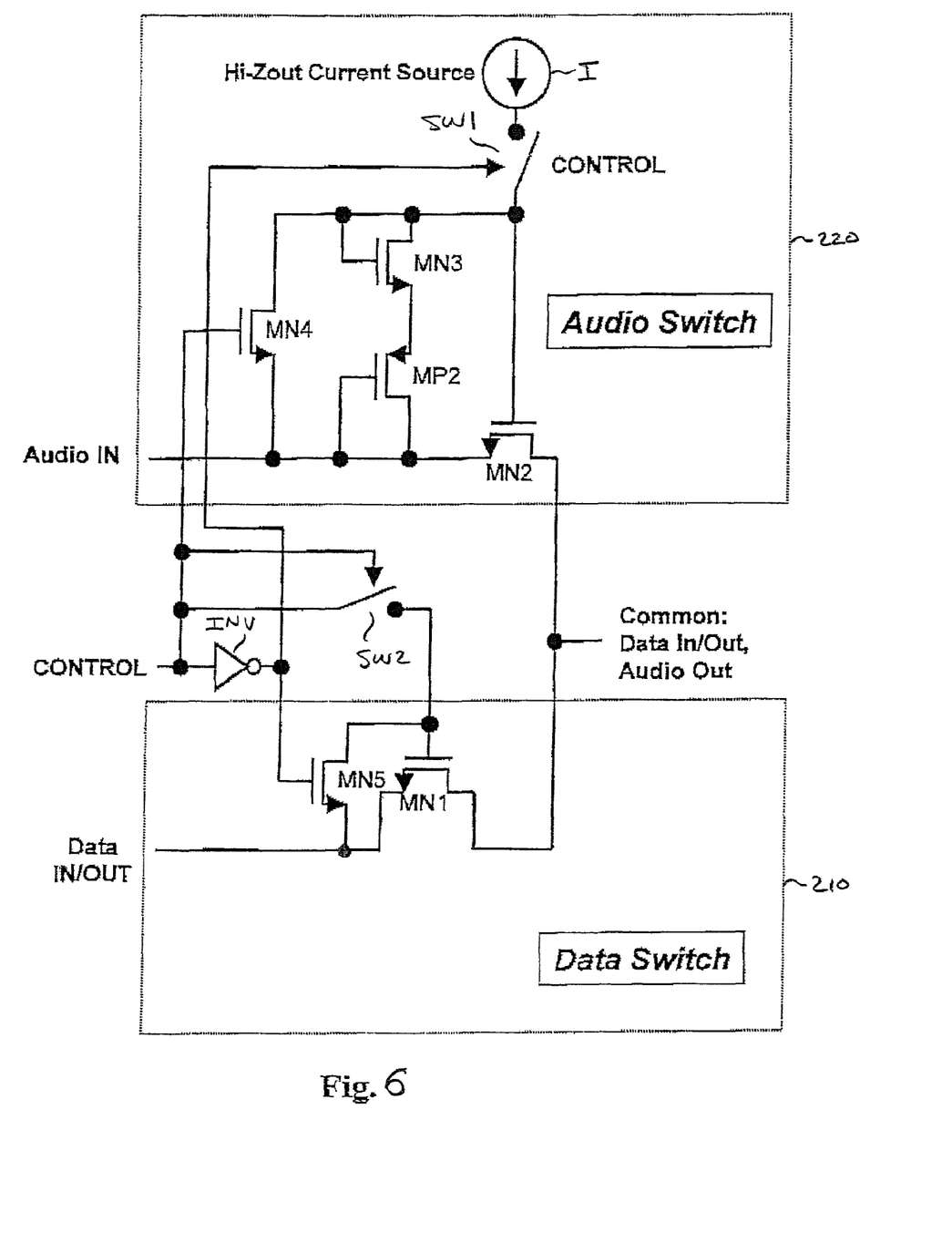
FIG. 6 schematically illustrates a fifth embodiment of the MOSFET-based, multi-signal switching circuit architecture of the invention, wherein the P-channel switching MOSFET for the data signal switching path in the embodiment of FIG. 5 has been eliminated.

A fifth embodiment of the invention, shown in FIG. 6, is configured identically to the fourth embodiment of FIG. 5 except that the embodiment of FIG. 6 dispenses with the P-channel switching MOSFET MP1 for the data signal switching path, so that only N-channel MOSFET MN1 is employed for the data signal switching path. This serves to reduce semiconductor circuit occupancy area and minimizes parasitic capacitance. Not having to include a P-channel switching MOSFET in the data signal switching path stems from the fact that certain applications employ digital data signals having a relatively reduced amplitude (e.g., on the order of only several hundred millivolts), which may be readily switched by means of the single N-channel device MN1.

As will be appreciated from the foregoing description, the multi-signal switching circuit architecture of the present invention provides a high signal quality analog/audio signal switch in combination with a high speed digital data signal switch, with each switch being tailored to improve the performance of the other. The analog/audio signal switch uses several techniques that give it properties that are very different from the standard analog CMOS switch of the prior art.

A first property is the fact that the gate-to-source voltage of the analog/audio signal circuit's switching MOSFET is effectively maintained at a constant voltage when the switching MOSFET is turned ON. This prevents the applied analog (audio) signal from modulating the ON-resistance of the audio signal switching MOSFET and causing distortion to the audio signals it couples to the common terminal.

Secondly, the analog/audio signal path uses only a single switching MOSFET to controllably pass analog/audio signals, as opposed to the use of a pair of complementary MOSFETs in the traditional analog switch design (FIG. 1a). As noted above, using only a single switching MOSFET in the analog/audio signal path minimizes circuit occupation area, cost, and capacitive loading at the common terminal with the digital data signal switch.

Thirdly, the data and analog/audio signal switches are readily manufacturable in a process that allows the switches to be isolated from the substrate connection, thereby permitting the analog/audio signal voltage to go below ground using a single power supply. The data signal switch is also tailored to minimize parasitic capacitances in the data path, thereby minimizing signal distortion and maximizing speed, thereby reducing data transfer time and allowing larger memory sizes, as well as blocking audio signals from the inputs to the digital circuitry, even when the level of the audio signal voltage goes negative (below ground). As noted previously, such properties and advantages of the multi-signal switching circuit architecture of the invention are especially useful in small hand-held devices having audio capability, such as MP3 players, cell phones, digital cameras, and personal digital assistants (PDAs), where small size, reduced cost, and high performance have become standard requirements.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. A MOSFET-based switching circuit for controllably coupling analog signals and digital signals through a common terminal comprising:

an analog signal switching circuit coupled between an analog signal input terminal and said common terminal, and containing only a single analog signal switching MOSFET, which has its source-drain path coupled between said analog signal input terminal and said common terminal, said analog signal switching circuit including a biasing circuit coupled to said analog signal switching MOSFET, said biasing circuit being operative to cause said analog signal switching MOSFET to have a substantially constant gate-to-source voltage; and a MOS-based, or CMOS-based, digital signal switching circuit formed of one of a single MOSFET having its source-drain path coupled between a digital signal input/output terminal and said common terminal, or a pair of complementary polarity MOSFETs having their source-drain paths coupled in parallel between a digital signal input/output terminal and said common terminal.

2. The MOSFET-based switching circuit according to claim 1, wherein, for a turned-ON condition of said single analog signal switching MOSFET, the source-drain path thereof exhibits an ON-resistance that minimizes distortion of analog signals passing through said source-drain path of said analog signal switching MOSFET to said common terminal, while simultaneously minimizing capacitive loading to said MOS-based or CMOS-based, digital signal switching circuit.

3. The MOSFET-based switching circuit according to claim 1, wherein said biasing circuit comprises a Zener diode coupled between gate and source terminals of said analog signal switching MOSFET, and a constant current source having its output controllably coupled to the gate terminal of said analog signal switching MOSFET.

4. The MOSFET-based switching circuit according to claim 1, wherein said biasing circuit comprises a resistor coupled between gate and source terminals of said analog signal switching MOSFET, and a constant current source having its output controllably coupled to the gate terminal of said analog signal switching MOSFET.

5. The MOSFET-based switching circuit according to claim 1, wherein said biasing circuit comprises an auxiliary MOSFET having gate and drain terminals thereof coupled to the gate terminal of said analog signal switching MOSFET, and the source terminal thereof coupled to the source terminal of said analog signal switching MOSFET, and a constant current source having its output controllably coupled to the gate terminal of said analog signal switching MOSFET.

6. The MOSFET-based switching circuit according to claim 5, wherein said auxiliary MOSFET and said analog signal switching MOSFET are substantially matched devices.

7. The MOSFET-based switching circuit according to claim 1, wherein each of said analog signal switching circuit and said MOS-based or CMOS-based, digital signal switching circuit includes a respective turn-OFF circuit that is operative to ensure turn-OFF of said single analog signal switching MOSFET of said analog signal switching circuit, and turn-OFF of said single MOSFET of said MOS-based, digital signal switching circuit or one of said complementary polarity MOSFETs of said CMOS-based, digital signal switching circuit, for respective turned-OFF states thereof.

8. The MOSFET-based switching circuit according to claim 7, wherein the respective turn-OFF circuit of said analog signal switching circuit comprises an analog signal path MOSFET having its source-drain path coupled to gate and source terminals of said single analog signal switching MOSFET, and its gate coupled to receive a turn-OFF control signal, and wherein the respective turn-OFF circuit of said MOS-based or CMOS-based, digital signal switching circuit comprises a digital signal path turn-OFF MOSFET having its source-drain path coupled to the source-drain path of said single MOSFET or one of said complementary polarity MOSFETs, and its gate coupled to receive a control signal complementary to that applied to the gate of said analog signal path turn-OFF MOSFET.

9. The MOSFET-based switching circuit according to claim 1, wherein said analog signal corresponds to an audio signal.

10. A method of controllably coupling analog signals and digital signals between respective analog signal and digital signal ports and a common terminal, said method comprising the steps of:
(a) coupling an analog signal switching circuit between said analog signal port and said common terminal, said analog signal switching circuit containing only a single analog signal switching MOSFET having its source-drain path coupled between said analog signal port and said common terminal;
(b) controllably turning said single analog signal switching MOSFET ON, so as to controllably couple analog signals applied to said analog signal port through said source-drain path of said single analog signal switching MOSFET to said common terminal, and biasing said single analog signal switching MOSFET, so as to cause said single analog signal switching MOSFET to have a substantially constant gate-to-source voltage;
(c) coupling one of a MOS-based, or CMOS-based, digital signal switching circuit between said digital signal port and said common terminal, said digital signal switching circuit containing a single MOSFET having its source-drain path coupled between said digital signal port terminal and said common terminal, or a pair of complementary polarity MOSFETs having their source-drain paths coupled in parallel between said digital signal port terminal and said common terminal; and
(d) controllably turning said single MOSFET or a selected one of said complementary polarity MOSFETs ON, so as to controllably couple digital signals between said digital signal port and said common terminal through the source-drain path of said single MOSFET or said selected one of said complementary polarity MOSFETs.

11. The method according to claim 10, wherein, for a turned-ON condition of said single analog signal switching MOSFET, said source-drain path thereof exhibits an ON-resistance that minimizes distortion of analog signals passing therethrough from said analog signal port to said common terminal, while simultaneously minimizing capacitive loading to said MOS-based or CMOS-based, digital signal switching circuit.

12. The method according to claim 10, wherein step (b) comprises coupling a Zener diode between gate and source terminals of said single analog signal switching MOSFET, and controllably supplying a constant current to said Zener diode and the gate terminal of said single analog signal switching MOSFET.

13. The method according to claim 10, wherein step (b) comprises coupling a resistor between gate and source terminals of said single analog signal switching MOSFET, and controllably supplying a constant current through said resistor and to the gate terminal of said single analog signal switching MOSFET.

14. The method according to claim 10, wherein step (b) comprises coupling gate and drain terminals of an auxiliary MOSFET to the gate terminal of said single analog signal switching MOSFET, coupling the source terminal of said auxiliary MOSFET to the source terminal of said single analog signal switching MOSFET, and controllably supplying a constant current to said auxiliary MOSFET and to the gate terminal of said single analog signal switching MOSFET.

15. The method according to claim 10, further including the steps of:
(e) for an intended OFF state of said single analog signal switching MOSFET, maintaining said intended OFF state thereof by means of a first turn-OFF circuit coupled to gate and source terminals of said single analog signal switching MOSFET; and
(f) for an intended OFF state of said single MOSFET of said digital signal switching circuit or said selected one of said complementary polarity MOSFETs, maintaining the intended OFF state thereof by means of a second turn-OFF circuit coupled to gate and source terminals of said single MOSFET or said selected one of said complementary polarity MOSFETs of said digital signal switching circuit.

16. The method according to claim 15, wherein said first turn-OFF circuit comprises an analog signal path MOSFET having its source-drain path coupled to the gate and source terminals of said single analog signal switching MOSFET, and its gate coupled to receive a turn-OFF control signal, and wherein said second turn-OFF circuit comprises a digital signal path turn-OFF MOSFET having its source-drain path coupled to the source-drain path of said single MOSFET or said selected one of said complementary polarity MOSFETs of said digital signal switching circuit, and its gate coupled to receive a control signal complementary to that applied to the gate of said single analog signal path turn-OFF MOSFET.

17. A switching apparatus comprising:
an analog signal switching circuit coupled between an analog signal input terminal and a common terminal, said analog signal switching circuit including:
a single analog signal switching MOSFET, which has its source-drain path coupled between said analog signal input terminal and said common terminal; and
a first turn-OFF circuit that is operative to ensure turn-OFF of said analog signal switching MOSFET, said first turn-OFF circuit comprising an analog signal path MOSFET having its source-drain path coupled to gate and source terminals of said single analog signal switching MOSFET, and its gate coupled to receive a turn-OFF control signal; and
a digital signal switching circuit including one of a single MOSFET having its source-drain path coupled between a digital signal input/output terminal and said common terminal, or a pair of complementary polarity MOSFETs having their source-drain paths coupled in parallel between a digital signal input/output terminal and said common terminal.

18. The switching apparatus according to claim 17, wherein said digital signal switching circuit comprises:
a second turn-OFF circuit that is operative to ensure turn-OFF of said single MOSFET or one of said complementary polarity MOSFETs, said second turn-OFF circuit comprising a digital signal path turn-OFF MOSFET having its source-drain path coupled to the source-drain path of said single MOSFET or one of said complementary polarity MOSFETs, and its gate coupled to receive a control signal complementary to that applied to the gate of said analog signal path turn-OFF MOSFET.

* * * * *